United States Patent
Takeuchi et al.

(10) Patent No.: US 10,411,438 B2
(45) Date of Patent: Sep. 10, 2019

(54) SEMICONDUCTOR MULTILAYER FILM REFLECTING MIRROR, VERTICAL CAVITY LIGHT-EMITTING ELEMENT USING THE REFLECTING MIRROR, AND METHODS FOR MANUFACTURING THE REFLECTING MIRROR AND THE ELEMENT

(71) Applicants: MEIJO UNIVERSITY, Nagoya-shi, Aichi (JP); STANLEY ELECTRIC CO., LTD., Meguro-ku, Tokyo (JP)

(72) Inventors: Tetsuya Takeuchi, Nagoya (JP); Isamu Akasaki, Nagoya (JP); Takanobu Akagi, Yokohama (JP)

(73) Assignees: STANLEY ELECTRIC CO., LTD., Tokyo (JP); MEIJO UNIVERSITY, Aichi (JP)

( * ) Notice: Subject to any disclaimer, the term of this patent is extended or adjusted under 35 U.S.C. 154(b) by 0 days.

(21) Appl. No.: 15/836,601

(22) Filed: Dec. 8, 2017

(65) Prior Publication Data

US 2018/0166855 A1    Jun. 14, 2018

(30) Foreign Application Priority Data

Dec. 13, 2016  (JP) .................................. 2016-241273

(51) Int. Cl.
*H01S 5/183*  (2006.01)
*H01S 5/026*  (2006.01)
(Continued)

(52) U.S. Cl.
CPC .......... *H01S 5/18377* (2013.01); *H01S 5/026* (2013.01); *H01S 5/18361* (2013.01);
(Continued)

(58) Field of Classification Search
CPC .. H01S 5/18377; H01S 5/026; H01S 5/18361; H01S 5/18341; H01S 5/18369;
(Continued)

(56) References Cited

U.S. PATENT DOCUMENTS 8,362,503 B2  1/2013  Saxler et al.
9,054,017 B2  6/2015  Saxler et al.
(Continued)

OTHER PUBLICATIONS

Takashi, et al., "1.7-mW nitride-based vertical-cavity surface-emitting lasers using AlInN/GaN bottom DBRs", 2016 ntemational Semiconductor Laser Conference (ISLC), ICICE-ES, Sep. 12, 2016, pp. 1-2 (Year: 2016).*

(Continued)

*Primary Examiner* — Armando Rodriguez
(74) *Attorney, Agent, or Firm* — Holtz, Holtz & Volek PC

(57) ABSTRACT

Provided is a semiconductor multilayer film reflecting mirror formed by alternately repeating a first nitride film containing In (indium) and a second nitride film not containing In. The reflecting mirror includes an inter-film transition layer between the first and second nitride films, the composition of which is varied from the composition of the first nitride film to the composition of the second nitride film. The inter-film transition layer has a first transition layer formed on the first nitride film and containing In and Al (aluminum), and a second transition layer formed on the first transition layer and containing Al but not containing In. In the first transition layer, the percentages of In and Al are decreased from the first nitride film to the second transition layer, and the percentage of In in the first transition layer starts to decrease at a same or closer position to the first nitride film than the percentage of Al.

12 Claims, 7 Drawing Sheets

(51) Int. Cl.
*H01L 21/02* (2006.01)
*H01S 5/32* (2006.01)
*H01S 5/323* (2006.01)
*H01S 5/30* (2006.01)

(52) U.S. Cl.
CPC ..... *H01L 21/02365* (2013.01); *H01S 5/18341* (2013.01); *H01S 5/18369* (2013.01); *H01S 5/3063* (2013.01); *H01S 5/3201* (2013.01); *H01S 5/32341* (2013.01); *H01S 2304/04* (2013.01)

(58) Field of Classification Search
CPC .. H01S 5/3063; H01S 5/3201; H01S 5/32341; H01S 2304/04
See application file for complete search history.

(56) References Cited

U.S. PATENT DOCUMENTS

2008/0217645 A1* 9/2008 Saxler ............... H01L 21/02381
257/101
2013/0221327 A1 8/2013 Saxler et al.

OTHER PUBLICATIONS

Extended European Search Report (EESR) dated May 2, 2018 issued in counterpart European Application No. 17206519.5.
Takashi, et al., "1.7-mW nitride-based vertical-cavity surface-emitting lasers using AlInN/GaN bottom DBRs", 2016 International Semiconductor Laser Conference (ISLC), ICICE-ES, Sep. 12, 2016, pp. 1-2.
C. Berger et al, "Growth of AlInN/GaN distributed Bragg reflectors with improved interface quality", Journal of Crystal Growth, vol. 414, 2015, p. 105-109.

* cited by examiner

SEMICONDUCTOR MULTILAYER FILM REFLECTING MIRROR, VERTICAL CAVITY LIGHT-EMITTING ELEMENT USING THE REFLECTING MIRROR, AND METHODS FOR MANUFACTURING THE REFLECTING MIRROR AND THE ELEMENT

BACKGROUND OF THE INVENTION

1. Field of the Invention

The present invention relates to a semiconductor multilayer film reflecting mirror and a vertical cavity light-emitting element employing the same, and more particularly, to a semiconductor multilayer film reflecting mirror for a vertical cavity semiconductor light-emitting element such as a vertical cavity surface emitting laser (VCSEL), and a vertical cavity light-emitting element. The invention also relates to methods for manufacturing the semiconductor multi layer film reflecting mirror and the vertical cavity light-emitting element.

2. Description of the Related Art

A vertical cavity surface emitting laser employing a semiconductor multilayer film reflecting mirror and a method for manufacturing the same are known. Also known is a technique for reducing the occurrence of micro cracks on a semiconductor film surface in the manufacture of the semiconductor multilayer film reflecting mirror (Non-Patent Literature 1: Journal of Crystal Growth, Volume 414, 2015, P 105).

For example, disclosed in Non-Patent Literature 1 is a distributed Bragg reflector (DBR) that is a semiconductor multilayer film reflecting mirror in which an AlInN layer and a GaN layer are alternately grown. Furthermore, it is also disclosed in Non-Patent Literature 1 that in the manufacture of the DBR, a GaN cap layer (low-temperature GaN cap layer) is formed with a GaN layer of 5 nm grown on the AlInN layer at the same temperature as the growth condition of the AlInN layer, and subsequently, the GaN layer (high-temperature GaN layer) is formed under the condition of a higher temperature, thereby reducing the occurrence of micro cracks on a DBR surface and providing improved flatness.

SUMMARY OF THE INVENTION

In manufacturing a semiconductor multilayer film reflecting mirror by layering semiconductor thin films having different refractive indices, it was problematic that defects such as micro cracks or threading dislocations were present at high density in the semiconductor thin film. For example, in manufacturing the semiconductor DBR as mentioned in Non-Patent Literature 1 above, it was difficult to reduce defects, for example, due to the occurrence of threading dislocations at a high density.

In particular, the vertical cavity light-emitting element requires a multilayer film reflecting mirror having a high reflectivity. For example, when a semiconductor multilayer film reflecting mirror having a high dislocation density is employed as the reflecting mirror of the vertical cavity light-emitting element, the crystallinity of a semiconductor layer grown on the semiconductor multilayer film reflecting mirror is also reduced and thus the optical output is lowered, so that high reliability is difficult to ensure. Thus, it was necessary to achieve a high reflectivity by providing improved flatness and crystallinity to the surface of semiconductor layers that constitute the multilayer film reflecting mirror.

The present invention has been made in view of the aforementioned problems. It is therefore an object of the present invention to provide a semiconductor multilayer film reflecting mirror having a low dislocation density and a method for manufacturing the same. It is another object to provide a vertical cavity light-emitting element which achieves a high output and high reliability, and a method for manufacturing the same.

A semiconductor multilayer film reflecting mirror according to one aspect of the present invention includes: first nitride semiconductor films containing In (indium) in a composition; second nitride semiconductor films not containing In in a composition, the first nitride semiconductor film and the second semiconductor film being alternately formed; and an inter-film transition layer provided between the first nitride semiconductor film and the second nitride semiconductor film, a composition of the inter-film transition layer being varied from the composition of the first nitride semiconductor film to the composition of the second nitride semiconductor film. The inter-film transition layer has a first transition layer formed on the first nitride semiconductor film and containing In and Al (aluminum) in a composition, and a second transition layer formed on the first transition layer and containing Al in a composition and not containing In in the composition. In the first transition layer, a percentage of In content (atomic %) and a percentage of Al content are decreased from the first nitride semiconductor film to the second transition layer, and the percentage of In content in the first transition layer starts to decrease at a position closer to the first nitride semiconductor film than or at a same position as a position where the percentage of Al content starts to decrease.

A semiconductor multilayer film reflecting mirror according to another aspect of the present invention is formed by alternately repeating a first nitride semiconductor film containing In in a composition, and a second nitride semiconductor film not containing In in a composition. The reflecting mirror is characterized as follows. An inter-film transition layer, the composition of which is varied along a layer thickness direction from the composition of the first nitride semiconductor film to the composition of the second nitride semiconductor film is provided between the first nitride semiconductor film and the second nitride semiconductor film. The inter-film transition layer has a first transition layer formed on the first nitride semiconductor film and containing In and Al in a composition, and a second transition layer formed on the first transition layer and containing Al in a composition and not containing In in the composition. In the first transition layer, with the percentage of content in the first nitride semiconductor film being normalized to 1, the normalized percentage of In content is less than the normalized percentage of Al content at any position in a layer thickness direction.

A vertical cavity light-emitting element according to further another aspect of the present invention includes: the semiconductor multilayer film reflecting mirror employed as a first reflecting mirror; a first semiconductor layer formed of at least one semiconductor layer on the first reflecting mirror; an active layer formed on the first semiconductor layer; a second semiconductor layer formed or the active layer and including at least one semiconductor layer having a conductivity type opposite to that of the first semiconductor layer; and a second reflecting mirror formed on the second semiconductor layer and opposed to the first reflecting mirror.

A method for manufacturing a semiconductor multilayer film reflecting mirror according to further another aspect of the present invention is to manufacture a semiconductor multilayer film reflecting mirror by a metal-organic chemical vapor deposition (MOCVD). The method includes a multilayering step of alternately growing in a repeated manner a first nitride semiconductor film containing In in a composition and a second nitride semiconductor film not containing In in a composition. The multilayering step includes: a step of growing the first nitride semiconductor film, and a step of forming an inter-film transition layer. The step of form-ng an inter-film transition layer is conducted by performing: a material gas supply step of supplying a material gas for the second nitride semiconductor film, after the growth of the first nitride semiconductor film and before a growth temperature of the second nitride semiconductor film is reached, under a time condition for forming the second nitride semiconductor film in a layer thickness greater than 0 nm and not greater than 1 nm; a holding step of holding for a predetermined period of time, after the material gas supply step, by stopping the supply of the material gas for the second nitride semiconductor film; and a temperature raising step of raising, after the holding step, the growth temperature to the growth temperature of the second nitride semiconductor film. The multilayering step further includes a step of growing, after the temperature raising step, the second nitride semiconductor film while supplying the material gas for the second nitride semiconductor film.

Furthermore, a method for manufacturing a semiconductor multilayer film reflecting mirror according to another aspect of the present invention is to manufacture a semiconductor multilayer film reflecting mirror by a metal-organic chemical vapor deposition (MOCVD). The method includes a multilayering step of alternately growing in a repeated manner a first nitride semiconductor film containing In and Al in a composition and a second nitride semiconductor film not containing In in a composition. The multilayering step includes a step of growing the first nitride semiconductor film, and a step of forming an inter-film transition layer. The step of forming an inter-film transition layer is conducted by performing: a first stop step of holding for a predetermined period of time while stopping supply of an In material gas after the growth of the first nitride semiconductor film and before a growth temperature of the second nitride semiconductor film is reached; a second stop step of stopping supply of an Al material gas after the first stop step; a cap layer forming step of forming, after the second stop step, a cap layer formed of the second nitride semiconductor film while supplying a material gas for the second nitride semiconductor film; and a temperature raising step of raising, after the cap layer forming step, the growth temperature to the growth temperature of the second nitride semiconductor film. The multilayering step further includes a step of growing, after the temperature raising step, the second nitride semiconductor film while supplying the material gas for the second nitride semiconductor film.

A method for manufacturing a vertical cavity light-emitting element according to another aspect of the present invention includes: a step of forming the semiconductor multilayer film reflecting mirror as a first reflecting mirror; a step of forming a first semiconductor layer formed of at least one semiconductor layer on the first reflecting mirror; a step of forming an active layer on the first semiconductor layer; a step of forming, on the active layer, a second semiconductor layer formed of at least one semiconductor layer having a conductivity type opposite to that of the first semiconductor layer; and a step of forming, on the second semiconductor layer, a second reflecting mirror opposed to the semiconductor multilayer film reflecting mirror.

DETAILED DESCRIPTION OF THE INVENTION

Figure 1:
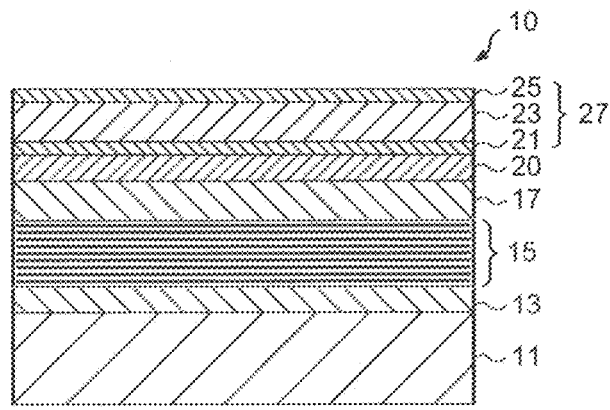
FIG. 1 is a cross-sectional view schematically illustrating a cross-sectional structure of a semiconductor light-emitting element wafer to be used to manufacture a vertical cavity light-emitting element.

A description will now be given of preferred embodiments of the present invention in more detail. Note that throughout the following description and the attached drawings, the same reference symbols are given to substantially the same or equivalent elements or portions.

First Embodiment

Referring to the drawings, a description will be given in detail of the crystal growth of a semiconductor light-emitting element wafer (hereafter also simply referred to as the semiconductor wafer) 10 to be used for a vertical cavity light-emitting element such as a vertical cavity surface emitting laser (VCSEL).

FIG. 1 is a cross-sectional view schematically illustrating a cross-sectional structure of the semiconductor wafer 10 to be used to manufacture a vertical cavity light-emitting element. In FIG. 1, on a substrate 11 of a C-plane GaN (gallium nitride) crystal used for crystal growth (hereafter also simply referred to as a growth substrate), an underlayer (buffer layer) 13 made of undoped GaN is formed.

A semiconductor multilayer film reflecting mirror 15 is formed on the buffer layer 13. On the semiconductor multilayer film reflecting mirror 15, a first semiconductor layer 17 of a first conductivity type and a light-emitting layer 20 are formed.

On the light-emitting layer 20, a second semiconductor layer 27 having a second conductivity type opposite to the first conductivity type is formed. In this embodiment, a description will be given of the case where the first conductivity type is an n-type, and the second conductivity type is a p-type. Note that the second semiconductor layer 27 is configured by forming, in the following order, a p-type AlGaN layer 21, a p-type GaN layer 23, and a p-type GaN contact layer 25.

Figure 2:
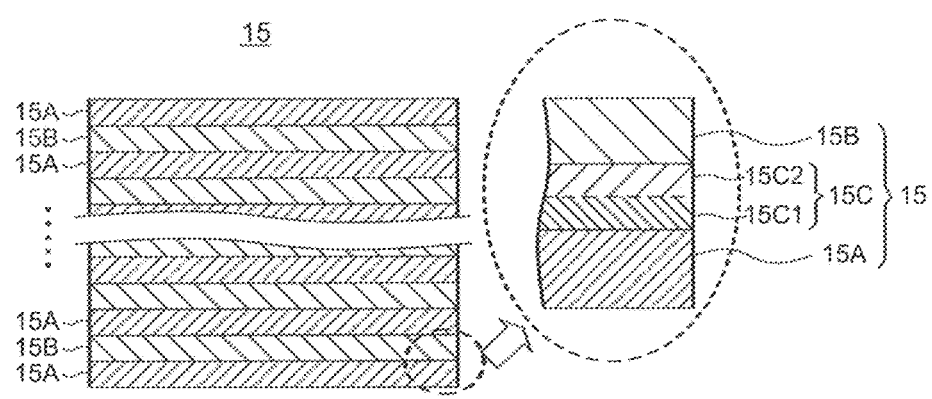
FIG. 2 is a cross-sectional view schematically illustrating a detailed structure of a multilayer film reflecting mirror according to the present invention.

FIG. 2 is a cross-sectional view illustrating a detailed cross-sectional structure of the semiconductor multilayer film reflecting mirror 15. As shown in FIG. 2, the semiconductor multilayer film reflecting mirror 15 is configured by alternately growing a first nitride semiconductor film 15A and a second nitride semiconductor film 15B.

The semiconductor multilayer film reflecting mirror 15 is a semiconductor distributed Bragg reflector (i.e. semiconductor DBR). More specifically, the semiconductor multilayer film reflecting mirror 15 is configured as a reflecting mirror having a reflection center wavelength that corresponds to the light emission wavelength of the light-emitting layer 20 (for example, the light emission wavelength in the air is 410 nm).

The first nitride semiconductor film 15A has a first refractive index $n_1$. Furthermore, the first nitride semiconductor film 15A has a ¼-wavelength optical thickness for a reflection center wavelength of 410 nm. That is, the first nitride semiconductor film 15A is a λ/4 optical film having the first refractive index $n_1$ and a first thickness $d_A$. Meanwhile, the second nitride semiconductor film 15B has a ¼-wavelength optical thickness for a reflection center wavelength of 410 nm. That is, the second nitride semiconductor film 153 is a λ/4 optical film having a second refractive index $n_2$ and a second thickness $d_B$.

In FIG. 2, illustrated is an enlarged view of an interface between the first nitride semiconductor film 15A and the second nitride semiconductor film 15B. In between the first nitride semiconductor film 15A and the second nitride semiconductor film 153, there is formed an inter-film transition layer 15C of which crystal composition is varied in the direction of lamination (i.e. the direction of growth) from the composition of the first nitride semiconductor film 15A to the composition of the second nitride semiconductor film 15B. For example, the inter-film transition layer 15C has a first transition layer 15C1 formed on the first nitride semiconductor film 15A and a second transition layer 15C2 formed on the first transition layer 15C1.

[Crystal Growth Process of Semiconductor Multilayer Film Reflecting Mirror]

A description will now be given of the crystal growth of the semiconductor multilayer film reflecting mirror 15, by the metal organic chemical vapor deposition (MOCVD), the crystal growth of III-V group nitride semiconductor layers that constitute the semiconductor multilayer film reflecting mirror 15 was conducted.

For the crystal growth, TMGa (trimethyl gallium), TEGa (triethyl gallium), TMA (trimethylaluminum), and TMI (trimethyl indium) were employed as group-III materials (MO raw materials), while ammonia ($NH_3$) was employed as group-V materials. Meanwhile, $SiH_4$ (silane) was employed as an n-type impurity material gas, and CP2Mg (cyclopentadienyl magnesium) was employed as a p-type impurity material gas.

On the growth substrate 11, the undoped GaN buffer layer 13 was grown in a layer thickness of 500 nm (nanometer). Note that the substrate temperature (i.e. growth temperature) was 1050° C. On the buffer layer 13, an AlInN layer as the first nitride semiconductor film 15A and a GaN layer as the second nitride semiconductor film 15B were alternately grown, thereby forming the semiconductor multilayer film reflecting mirror 15.

Figure 3:
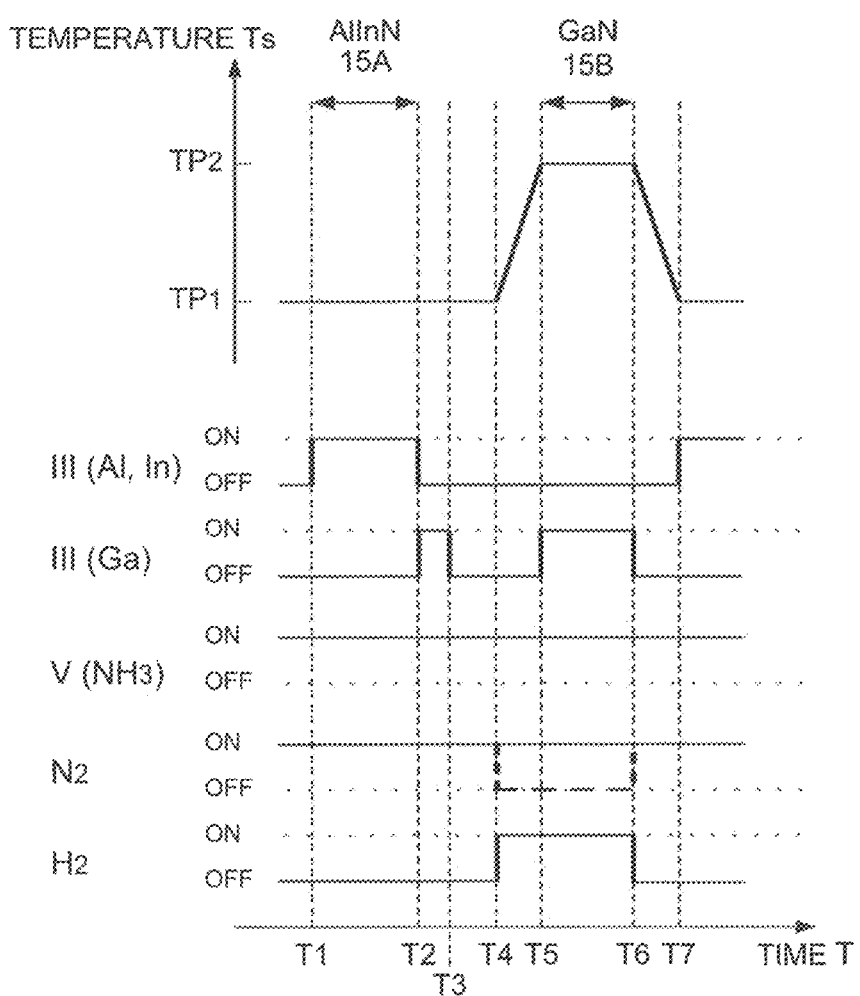
FIG. 3 is a view schematically illustrating a crystal growth sequence of a multilayer film reflecting mirror according to a first embodiment.

FIG. 3 is a view schematically illustrating the crystal growth sequence of the semiconductor multilayer film reflecting mirror 15. First, the first nitride semiconductor film 15A was grown ort the undoped GaN layer 13. More specifically, as illustrated in the growth sequence of FIG. 3, at a substrate temperature (growth temperature) Ts of 815° C. (=TP1: a first growth temperature), nitrogen ($N_2$) was supplied as a carrier gas (ambient gas) ("ON" in the figure), and group-III MO (metal organic) materials such as TMA and TMI as well as a group-V material such as ammonia ($NH_3$) were supplied into a reaction furnace ("ON" in the figure). Meanwhile, the first nitride semiconductor film 15A or an $Al_{0.82}In_{0.18}N$ crystal layer with a layer thickness of 45 nm was grown (time T=T1 to T2). Note that the carrier gas (ambient gas) may be an inert gas such as Ar (argon) or Ne (neon), or alternatively, may also be a mixture of these inert gases.

Next, with the substrate temperature Ts maintained at 815° C. (=TP1), while ammonia ($NH_3$) being supplied, the supply of TMA and TMI was stopped (III (Al, In) "OFF" in the figure), and TEGa was supplied into the reaction furnace. Meanwhile, the inter-film transition layer 15C was formed. Note that the supply time of TEGa is equivalent to the condition of forming a GaN crystal layer with a layer thickness of 1 nm or less (T2 to T3).

Subsequently, the supply of TEGa was stopped, and the crystal growth was interrupted (T=T3 to T4). After that, the carrier gas was changed from nitrogen to hydrogen ($H_2$), and the substrate temperature Ts was raised to 1,050° C. (=TP2: a second growth temperature) (T=T4 to T5). At the substrate temperature Ts of 1,050° C., TMGa was supplied to form the second nitride semiconductor film 15B or a GaN crystal layer with a layer thickness of about 40 nm (T=T5 to T6). In this manner, the inter-film transition layer 15C and the second nitride semiconductor film 15B were formed on the first nitride semiconductor film 15A. Subsequently, the substrate temperature Ts was decreased to 815° C. (=TP1) (T=T6 to T7).

Subsequently, following the aforementioned growth sequence, the growth of the first nitride semiconductor film 15A (T=T1 to T2) and the growth of the inter-film transition layer 15C and the second nitride semiconductor film 15B (T=T2 to T7) were alternately repeated.

As described above, the semiconductor multilayer film reflecting mirror 15 formed from a nitride semiconductor for which the first nitride semiconductor film 15A that is an AlInN layer and the second nitride semiconductor film 15B that is a GaN layer were alternately layered was formed on the undoped GaN layer 13.

At this time, the inter-film transition layer 15C of which crystal composition was gradually varied in the direction of lamination (direction of growth) from the composition of the first nitride semiconductor film 15A to the composition of the second nitride semiconductor film 15B was formed between the first nitride semiconductor film 15A and the second nitride semiconductor film 15B. Note that in this embodiment, the first nitride semiconductor film 15A and the second nitride semiconductor film 15B were alternately layered so that the first nitride semiconductor film 15A was stacked in 41 layers and the second nitride semiconductor film 15B was stacked in 40 layers.

Note that the second nitride semiconductor film 15B is preferably grown in an ambient gas containing hydrogen or only in a hydrogen gas. Note that it FIG. 3, the broken line in the flow of $N_2$ (T4 to T6) denotes the case in which the supply of a nitrogen gas was stopped and only hydrogen gas was used as an ambient gas.

[Growth Process of Semiconductor Light Emission Structure Layer of Vertical Cavity Light-Emitting Element]

A description will now be given of a semiconductor light emission structure layer of the vertical cavity light-emitting element. Referring back to FIG. 1, an n-type GaN layer 17 at a growth temperature of 1050° C. in a layer thickness of 430 nm was grown on the semiconductor multilayer film reflecting mirror 15. Note that Si was doped at a concentration of $7 \times 10^{18}$ cm$^{-3}$.

The light-emitting layer 20 of a quantum well structure that is constituted by a GaInN quantum well layer and a GaN barrier layer was grown on the n-type GaN layer 17.

A p-type $Al_{0.15}Ga_{0.85}N$ layer 21 with a layer thickness of 20 nm was grown on the light-emitting layer 20. Note that Mg was doped at a concentration of $2 \times 10^{19}$ cm$^{-3}$. The p-type $Al_{0.15}Ga_{0.85}N$ layer 21 functions as an electron blocking layer.

The p-type GaN layer 23 as a p-type clad layer with a layer thickness of 70 nm was grown on the p-type $Al_{0.15}Ga_{0.85}N$ layer 21. Note that Mg was doped at a concentration of $2 \times 10^{19}$ cm$^{-3}$.

The p-type GaN contact layer 25 was grown on the p-type GaN layer 23. Note that Mg was doped at a concentration of $2 \times 10^{20}$ cm$^{-3}$.

Through the steps mentioned above, the semiconductor light emission structure layer which was formed from the first semiconductor layer (n-type GaN layer) of the first conductivity type (n-type in this embodiment), the active layer (or light-emitting layer), and the second semiconductor layer (p-type AlGaN layer, p-type GaN layer, and p-type GaN contact layer) having the second conductivity type (p-type) opposite to the first conductivity type was formed on the semiconductor multilayer film reflecting mirror 15.

Note that the compositions of the first and second semiconductor layers are not limited to those mentioned above. Furthermore, the first and second semiconductor layers may also be configured as a nitride semiconductor layer having at least one semiconductor layer. For example, semiconductor layers of different crystal compositions may also be layered. Furthermore, the semiconductor layers may also have a so-called electron blocking layer, hole blocking layer, or contact layer. Or alternatively, semiconductor layers of different impurity concentrations may also be layered. Furthermore, for example, there may be formed a tunnel-junction semiconductor layer on a second semiconductor layer having the second conductivity type opposite to the first conductivity type.

Through the steps mentioned above, the semiconductor light emission structure layer of the vertical cavity light-omitting element that has a cavity length equivalent to an integral multiple of a wavelength (four wavelengths in this embodiment) was formed on the semiconductor multilayer film reflecting mirror 15.

[Vertical Cavity Surface Emitting Laser]

Figure 4:
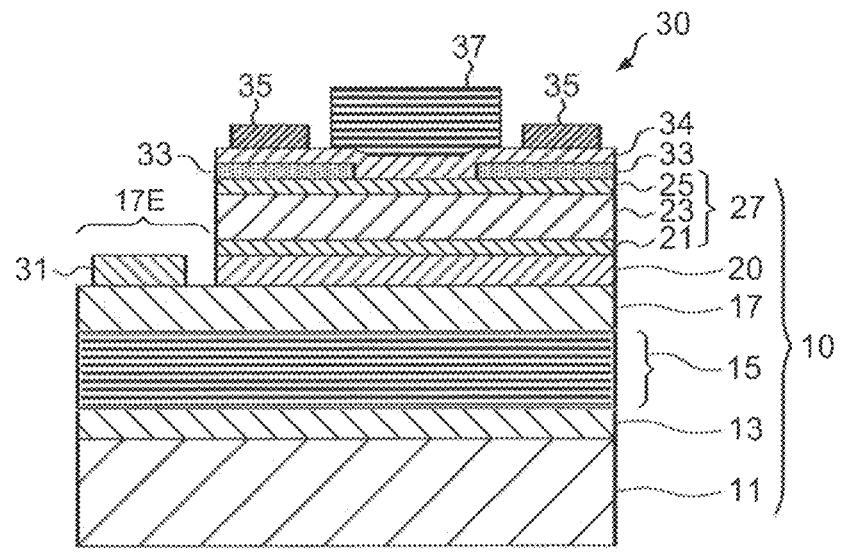
FIG. 4 is a cross-sectional view schematically illustrating a cross-sectional structure of an example of a vertical cavity surface emitting laser (VCSEL)

A description will now be given of the structure and manufacturing process of a vertical cavity surface emitting laser (VCSEL) 30 as an example of the vertical cavity light-emitting element. FIG. 4 is a cross-sectional view schematically illustrating a cross-sectional structure of the vertical cavity surface emitting laser (VCSEL) 30.

As shown in FIG. 4, the VCSEL 30 has a structure in which an insulating film 33, a transparent electrode 34, and a dielectric multilayer film reflecting mirror 37 were formed on the second semiconductor layer 27 of the aforementioned semiconductor wafer 10 in that order. Furthermore, a p-electrode 35 that is electrically connected to the transparent electrode 34 is provided on the transparent electrode 34. Furthermore, the VCSEL 30 has an exposed portion 17E formed by the first semiconductor layer 17 being partially exposed. On the exposed portion 17E, an n-electrode 31 that is electrically connected to the first semiconductor layer 17 is provided.

The vertical cavity surface emitting laser (VCSEL) 30 was manufactured using the aforementioned semiconductor wafer 10. A description will now be given of a method for manufacturing the VCSEL 30. First, after the organic cleaning of the semiconductor wafer 10, hydrogen was desorbed from the p-type semiconductor layer to thereby activate Mg that was a p-type dopant.

Next, the semiconductor wafer 10 was patterned using a photoresist so as to partially etch the semiconductor wafer 10, thereby exposing the n-type GaN layer 17 (the exposed portion 17E). For example, the etching can be the dry etching with a chlorine gas.

For example, a circular photoresist of a diameter of 10 μm (micrometer) was formed on the p-type GaN contact layer 25 by patterning. Next, a $SiO_2$ film was deposited in a thickness of 20 nm and lifted off, thereby forming the insulating film 33 having an opening of a diameter of 10 μm at the center thereof.

To cover the p-type GaN contact layer 25 that is exposed from the opening of the insulating film 33, the transparent electrode 34 was formed as a p-side contact electrode on the insulating film 33. The transparent electrode 34 was formed by depositing a metal oxide such as ITO (Indium Tin Oxide).

On the outer circumferential portion of the transparent electrode 34 or at least outside the opening of the insulating film 33, the p-electrode 35 having a pad for wire bonding was formed. The p-electrode 35 can be formed by depositing, for example, Ti (titanium)/Au (gold).

Furthermore, the n-electrode 31 was formed on the exposed portion 17E of the n-type GaN layer 17. For example, Ti/Al/Ti/Au was deposited to thereby form the n-electrode 31.

Finally, a dielectric film was layered on the transparent electrode 34 by photolithography and lift-off to form a dielectric multilayer film reflecting mirror (dielectric DBR) 37. The dielectric multilayer film reflecting mirror 37, which is a dielectric multilayer film having a reflection center wavelength of 410 nm, can be formed by layering, for example, $SiO_2$ film/$Nb_2O_5$ film. In the foregoing, the description has been given of the example in which the dielectric multilayer film reflecting mirror 37 was formed on the second semiconductor layer via the transparent electrode 34 and the insulating film 33 However, the dielectric multilayer film reflecting mirror 37 is not limited thereto as long as the dielectric multilayer film reflecting mirror 37 is disposed on the second semiconductor layer to be opposed to the semiconductor multilayer film reflecting mirror 15.

That is, the dielectric multilayer film reflecting mirror 37 functions as a reflecting mirror (second reflecting mirror)

disposed to be opposed to the semiconductor multilayer film reflecting mirror 15 (first reflecting mirror), so that the semiconductor multilayer film reflecting mirror 15 and the dielectric multilayer film reflecting mirror 37 constitute a reflective cavity.

Through the aforementioned steps, the vertical cavity surface emitting laser (VCSEL) 30 is manufactured which has a cavity length equivalent to an integral multiple of a wavelength (four wavelengths in the aforementioned embodiment).

Note that the description has been given of the case where an electrode was formed on the first semiconductor layer formed on the semiconductor multilayer film reflecting mirror 15. However, the electrode may only have to be configured to inject current into the active layer. For example, the semiconductor multilayer film reflecting mirror 15 may be doped with an impurity to have the first conductivity type, and the electrode may be connected to the resulting semiconductor multilayer film reflecting mirror 15.

[Comparison Between Composition and Crystallinity of Semiconductor Multilayer Film Reflecting Mirror (Semiconductor DBR) 15]

Figure 5A:
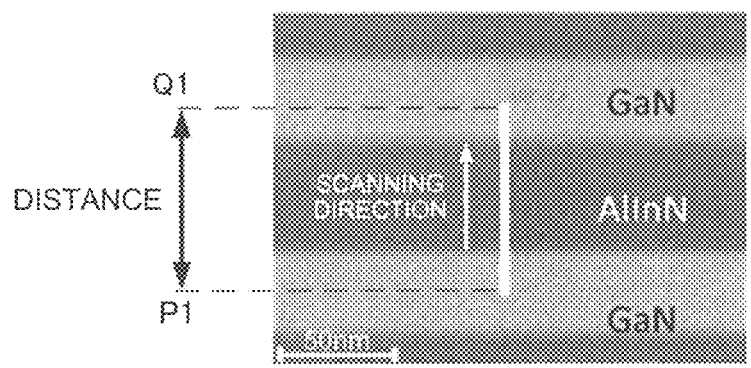
FIG. 5A is a TEM observation image of a cross section of a multilayer film reflecting mirror according to the present invention.

The composition and the crystallinity of the semiconductor multilayer film reflecting mirror according to this embodiment were evaluated. FIG. 5A is an observation image acquired by observing a cross section of the semiconductor multilayer film reflecting mirror 15 under the transmission electron microscope (TEM). As shown in FIG. 5A, the two GaN layers and the AlInN layer sandwiched between the GaN layers were observed by TEM. Furthermore, in the direction of lamination of the semiconductor multilayer film reflecting mirror 15 in the observed region of FIG. 5A, an element analysis was conducted by energy dispersion X-ray analysis (TEM-EDX) provided to the TEM.

More specifically, the interval from position F1 to position Q1 (interval P1 to Q1) shown in FIG. 5A was scanned by being irradiated with an electron beam to conduct an EDX analysis. The scanning direction shown in FIG. 5A is the direction of growth of the semiconductor multilayer film reflecting mirror 15.

Figure 5B:
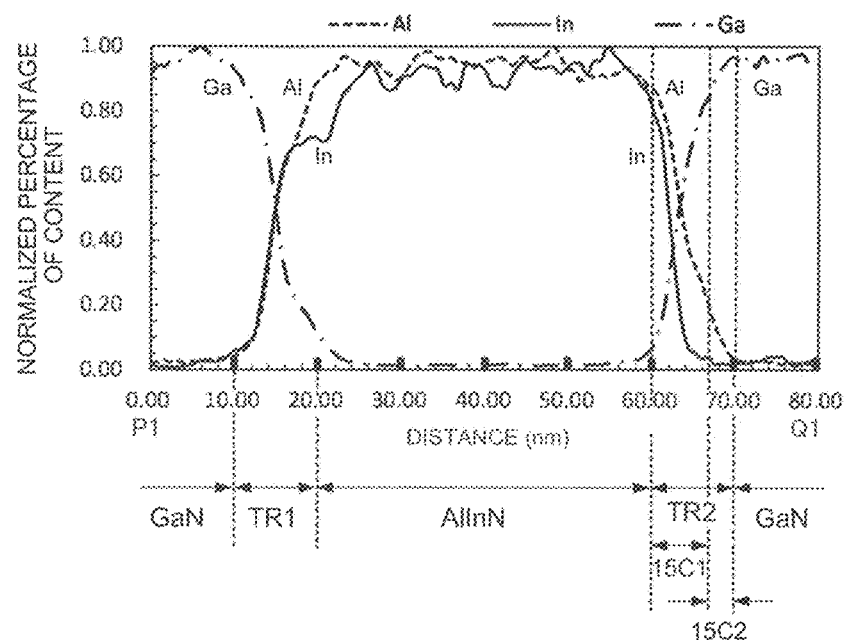
FIG. 5B is a graph indicative of a TEM-EDX analysis result of a cross section of a multilayer film reflecting mirror according to the present invention.
Figure 5C:
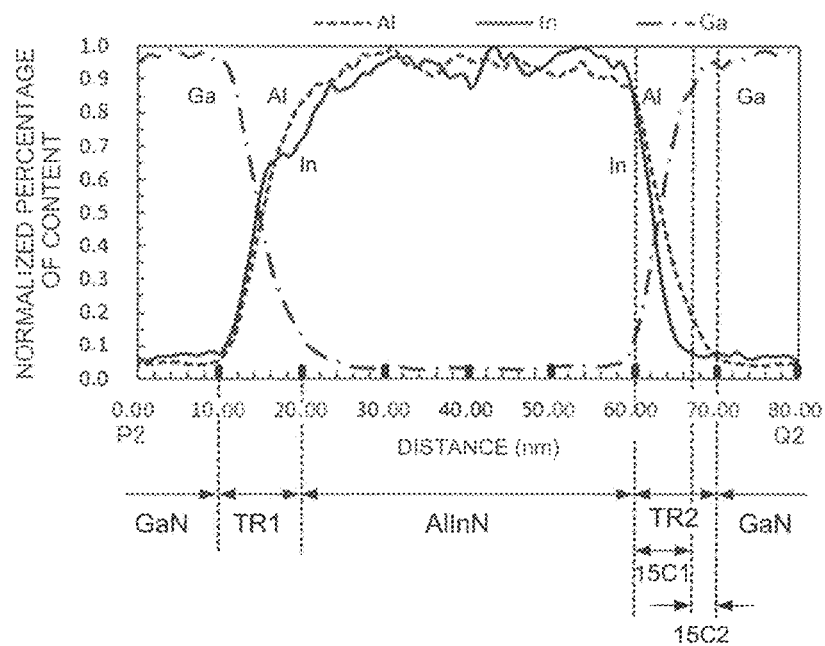
FIG. 5C is a graph indicative of a TEM-EDX analysis result of a cross section of a multilayer film reflecting mirror according to the present invention.

FIGS. 5B and 5C show the results of the EDX analysis. FIG. 5B shows the normalized percentage of content (atomic %) of each of the elements Al, In, and Ga in the AlInN layer and the GaN layer with respect to the distance from the start position of scanning, i.e., the position P1. FIG. 5C also shows the results of measurements acquired likewise for a different interval P2 to Q2 in the same semiconductor multilayer film reflecting mirror 15.

More specifically, FIGS. 5B and 5C show the normalized percentages of Al and In contents in the composition transition region between the AlInN layer and the GaN layer with the maximum value of the percentage of each of the Al and In contents in the AlInN layer being normalized to 1. Likewise, the percentage of Ga content is shown by normalizing the maximum percentage of Ga content in the GaN layer to 1.

Referring to FIGS. 5A, 5B, and 5C, in the graphs of FIGS. 5B and 5C, the region between the distances from about 0.00 to 10.00 nm corresponds to the GaN layer 15B, the region from about 10.00 to 20.00 nm corresponds to the composition transition region (TR1 in the figure) on the GaN layer 15B to the AlInN layer 15A, and the region from about 20.00 to 60.00 nm corresponds to the AlInN layer 15A.

Likewise, the region between the distances from about 60.00 to 70.00 nm in the graphs of FIGS. 5E and 5C corresponds to the composition transition region (TR2 in the figure) on the AlInN layer 15A between the same and the GaN layer 15B, that is, the inter-film transition layer 15C. Furthermore, the region between the distances from about 70.00 to 80.00 nm corresponds to the GaN layer 15B on the inter-film transition layer 15C.

The composition of the inter-film transition layer 15C was focused to compare the normalized percentages of content of each element. In TR2 of the figures, as the distance from the position P1 or P2 increases, that is, in the direction of lamination, the normalized percentages of In and Al content are gradually reduced with increases in the normalized percentage of Ga content and become substantially zero by the distance where the position Q1 or Q2 is reached.

More specifically, the normalized percentage of In content is greater in the degree of decrease (i.e., greater in the gradient of decrease) in the direction of lamination than the normalized percentage of Al content, and thus reduced to zero first. Furthermore, the start position of the decrease of In is closer to the AlInN layer than or the same as that of Al. In FIG. 5B, In starts to decrease at a position closer to the AlInN layer than Al, while in FIG. 5C, In and Al start to decrease at the same position. Thus, a layer containing In in the composition and a layer not containing In in the composition are formed in the inter-film transition layer 15C.

The layer containing in in the composition is illustrated in the figure as the first transition layer 15C1. Furthermore, the layer not containing In in the composition is illustrated in the figure as the second transition layer 15C2. In the first transition layer 15C1, the value of normalized percentage of In content in the direction of lamination monotonously decreases to substantially zero. The start position of the decrease of In is closer to the AlInN layer than or the same as that of Al. In the first transition layer 15C1, the normalized percentages of In content from the start of decrease in the composition are less than those of Al content at all the positions in the direction of layer thickness (i.e. the growth direction) along a direction perpendicular to the first transition layer 15C1. Thus, the first transition layer 15C1 is a composition varying layer of AlGaInN which contains Al, Ga, and In in the composition and is varied in composition in the direction of lamination.

In the second transition layer 15C2, the value of the normalized percentage of In content is substantially zero, and the normalized percentage of Al content monotonously decreases in the direction of lamination to substantially zero. Thus, the second transition layer 15C2 is a composition varying layer of AlGaN which does not contain In the direction of composition and is varied in composition in the direction of lamination.

Note that the description has been given of the case where in the first transition layer 15C1 and the second transition layer 15C2, the composition monotonously charges in the direction of lamination. However, this is not limitative, and the composition may also vary in a stepwise manner. In the first transition layer 15C1, the normalized percentage of In content may only have to be configured such that In is reduced to zero at a position closer to the AlInN layer than Al in the direction of lamination or at the same position. Meanwhile, in the second transition layer 15C2, the normalized percentage of Al content may only have to be reduced to zero in the direction of lamination.

As described above, the composition of the inter-film transition layer 15C is varied by degrees in the direction of lamination of the semiconductor multilayer film reflecting mirror 15 from the composition of the first nitride semiconductor film 15A to the composition of the second nitride semiconductor film 15B.

Further, the inter-film transition layer 15C has: the first transition layer 15C which contains In and Al in the composition and is reduced in the percentage of In and Al content in the direction of lamination (growth direction); and the second transition layer 15C2 which does not contain In in the composition but contains Al in the composition, and is reduced in the percentage of Al content in the direction of lamination.

Figure 6A:
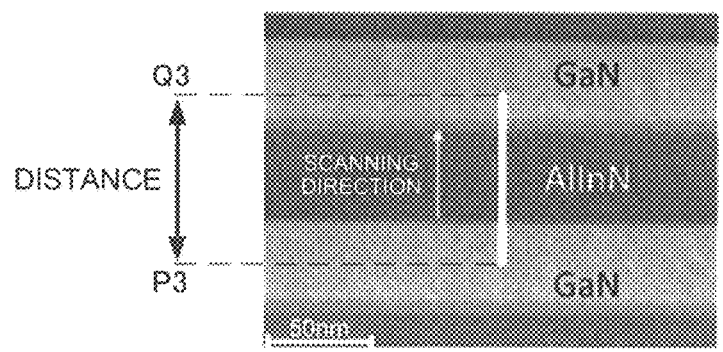
FIG. 6A is a TEM observation image of a cross section of a multilayer film reflecting mirror according to a comparative example.

FIG. 6A is an observation image acquired by observing, by TEM, a cross section of a semiconductor multilayer film reflecting mirror as a comparative example. The semiconductor multilayer film reflecting mirror of the comparative example is formed by alternately layering the AlInN layer 15A and the GaN layer 15B. Furthermore, in the formation of the semiconductor multilayer film reflecting mirror of the comparative example, after the formation of the AlInN layer 15A and before the formation of the GaN layer 15B, in the conditions (a gas supply condition and a time condition) in which the GaN layer is grown by 5 nm under the same substrate temperature condition as that for the AlInN layer 15A (i.e., at a temperature lower than the growth condition of the GaN layer 15B), a Ga material gas (TEGa) was supplied to form the GaN layer. The GaN layer is referred to as the GaN cap layer. The multilayer film reflecting mirror of the comparative example is different from the semiconductor multilayer film reflecting mirror 15 of the embodiment in that the material gases were supplied to form the GaN layer at the same growth temperature as that for the AlInN layer 15A and in a growth time longer than that in the first embodiment.

Note that in this embodiment, after the growth of the first nitride semiconductor film 15A and before the growth temperature of the second nitride semiconductor film 15B is reached, the inter-film transition layer 15C was formed by growing the same in a condition for forming an extremely thin (for example, 1 nm or less) GaN layer.

Figure 6B:
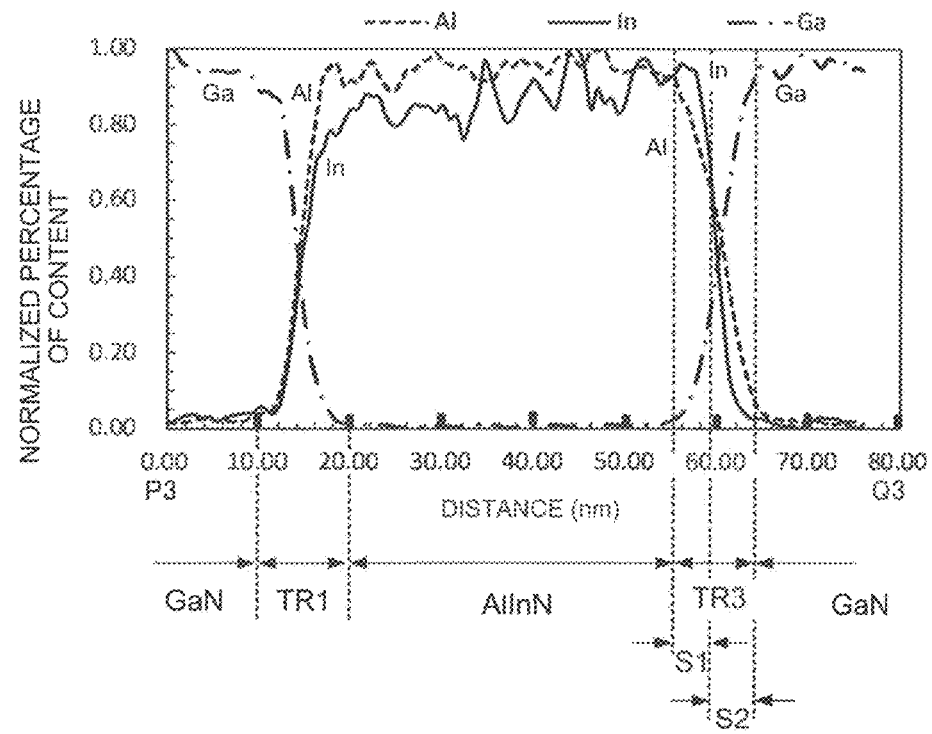
FIG. 6B is a graph indicative of a TEM-EDX analysis result of a cross section of a multilayer film reflecting mirror according to a comparative example.

FIG. 6B is a graph indicative of the result acquired by performing TEM-EDX analysis, on the target of FIG. 6A being observed, by the same technique as that of the first embodiment (FIG. 5B). Like the case of the first embodiment, FIG. 6B shows the normalized percentage of content of each element for the interval P3 to Q3 from position P3 to position Q3. In FIG. 6b, the region between the region corresponding to the AlInN layer 15A and the region corresponding to the GaN layer 15B (i.e., on the greater distance sides on the AlInN layer 15A corresponds to the composition transition region between the AlInN layer 15A and the GaN layer 15B grown on the AlInN layer 15A (which is illustrated as a transition region TR3 in FIG. 6B).

The comparative example is common to the case of the present invention (FIGS. 5B and 5C) in that in the region TR3 of FIG. 6B, the normalized percentage of Ga content increases in the direction of lamination (i.e. growth direction), whereas the normalized percentages of Al and In contents gradually reduce. However, the comparative example is different from the case of FIGS. 5B and 5C in that on the AlInN layer 15A, there exists a region (S1 in the figure) where the normalized percentage of In content is decreased at a lower rate than the normalized percentage of Al content in the direction of lamination. More specifically, the region S1 is different from the first transition layer 15C1 of the present invention in that at any position in the region S1, the normalized percentage of In content is greater than the normalized percentage of Al content. Thus, the composition transition layer corresponding to the region TR3 between the AlInN layer and the GaN layer of the comparative example is different from the inter-film transition layer 15C of the present invention. Note that the first transition layer 15C1 of the present invention is configured such that the normalized percentage of In content is less than the normalized percentage of Al content at any position.

Figure 7A:
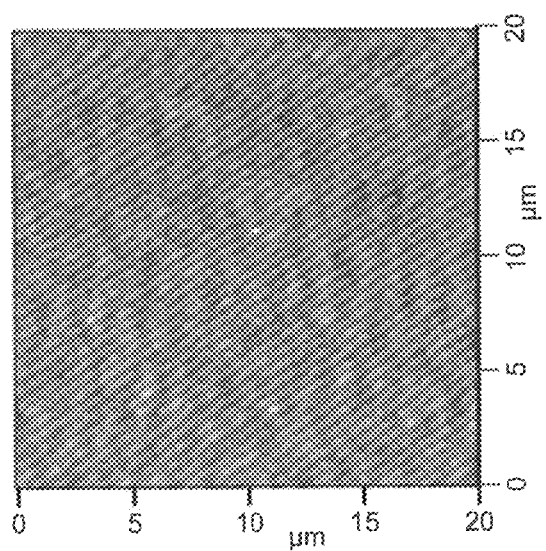
FIG. 7A is an observation image acquired under an atomic force microscope (AFM) by observing a surface of a multilayer film reflecting mirror according to the present invention.

FIG. 7A is an observation image acquired by observing a surface of the semiconductor multilayer film reflecting mirror 15 of this embodiment under the atomic force microscope (AFM). That is, FIG. 7A is an AFM image acquired by observing a surface of the semiconductor multilayer film reflecting mirror 15 with the inter-film transition layer 15C formed, on the first nitride semiconductor film 15A or the AlInN layer, between the first nitride semiconductor film 15A and the second nitride semiconductor film 15B (the GaN layer).

Figure 7B:
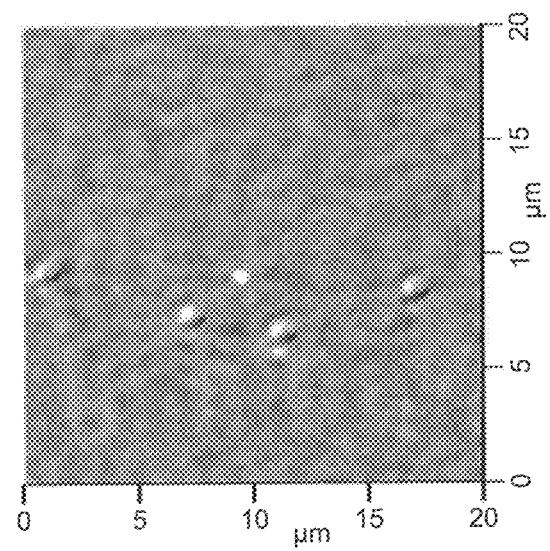
FIG. 7B is an AFM image of a surface of a multilayer film reflecting mirror according to a comparative example.

FIG. 7B is an AFM image acquired by observing a surface of the multilayer film reflecting mirror as the comparative example. The multilayer film reflecting mirror of the comparative example is configured such that a GaN layer (GaN cap layer) grown at the same temperature as the growth temperature of the first nitride semiconductor film 15A is formed, on the first nitride semiconductor film 15A, between the first nitride semiconductor film 15A and the second nitride semiconductor film 15B. Thus, the multilayer film reflecting mirror of the comparative example is provided with a transition layer that is different from the inter-film transition layer 15C of this embodiment. Note that for observation of surfaces, any of the multilayer film reflecting mirrors was formed by alternately layering the AlInN layer 15A and the GaN layer 15B, each repeated ten times.

The semiconductor multilayer film reflecting mirror 15 of the embodiment shown in FIG. 7A had a dislocation density of about $3\times10^4$ cm$^{-2}$. Meanwhile, the multilayer film reflecting mirror of the comparative example shown in FIG. 7B had a dislocation density of about $2\times10^6$ cm$^{-2}$. That is, the semiconductor multilayer film reflecting mirror had a dislocation density that was reduced by two orders of magnitude because of the formation of the inter-film transition layer 15C of the present invention.

As a mechanism for such reduction of dislocations, it is conceivable to reduce the clusters of In (indium) on the AlInN/GaN interface. In the case where the GaN cap layer of 5 nm is formed like the multilayer film reflecting mirror of the comparative example, the desorption of In can be reduced so as to reduce the occurrence of micro cracks. However, when the desorption of In is excessively reduced, it is conceivable that the clusters of In is easily produced, causing the occurrence of dislocations.

It is suggested that the formation of the inter-film transition layer 15C in the region (i.e. transition region) on the AlInN layer 15A between the AlInN layer 15A and the GaN layer 15B reduced the occurrence of the clusters of In and reduced the dislocations arising from the AlInN/GaN interface without excessively reducing the desorption of In. For example, in the region 15C1 illustrated in FIGS. 5B and 5C, since the normalized percentage of In content is decreased to zero first at a greater rate than the normalized percentage of Al content, it is suggested that the occurrence of the In cluster is reduced.

As described above, according to the semiconductor multilayer film reflecting mirror of this embodiment, the dislocation density of the multilayer film reflecting mirror can be greatly reduced to achieve a high quality crystallinity, thereby providing a reflecting mirror having a high reflectivity. It is also possible to significantly reduce the dislocation density of a semiconductor layer formed on the semiconductor multilayer film reflecting mirror. It is thus possible to provide a vertical cavity light-emitting element which has a high optical output and high reliability.

Second Embodiment

A semiconductor DBR and a vertical cavity light-emitting element of this embodiment are different from those of the first embodiment in the method for forming the semiconductor DBR, but is the same in the configuration of the semiconductor DBR and the other points.

Figure 8:
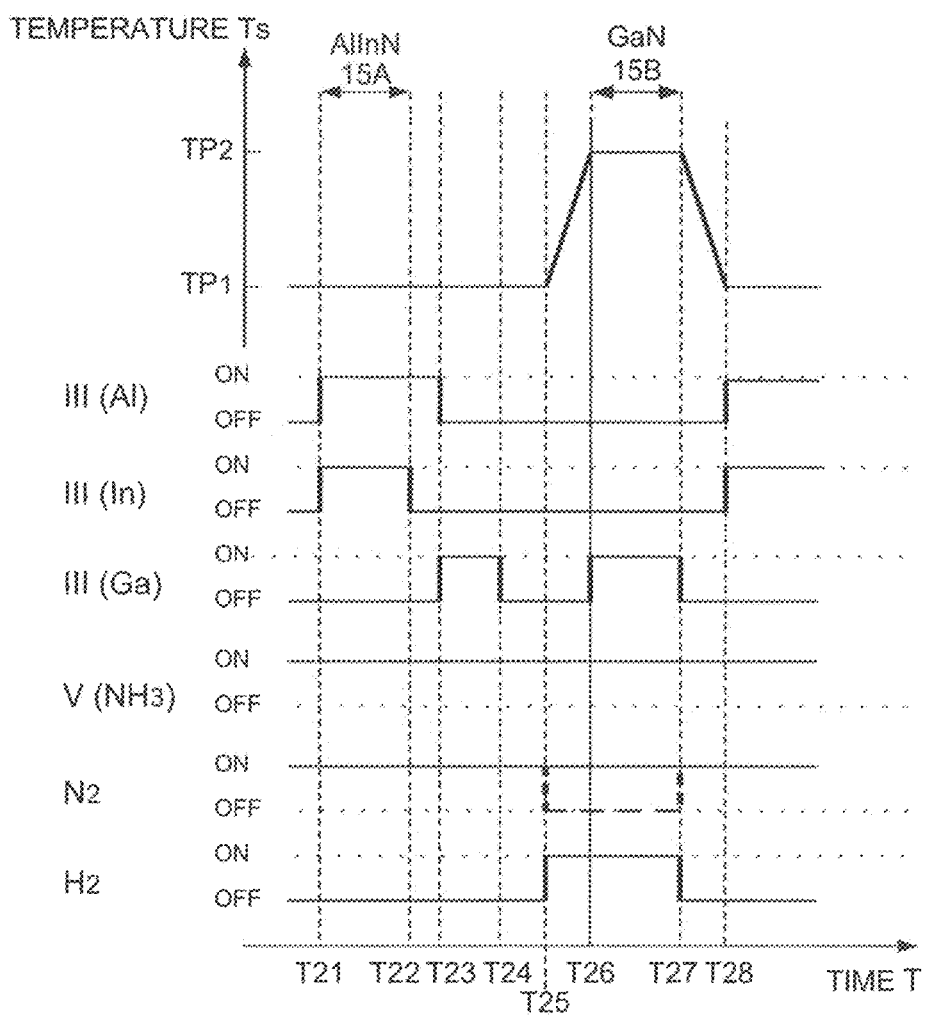
FIG. 8 is a view schematically illustrating a crystal growth sequence of a second embodiment of a multilayer film reflecting mirror according to the present invention.

Referring to FIG. 8, a description will now be given of the method for manufacturing the semiconductor DBR of this embodiment. FIG. 8 is a view schematically illustrating the crystal growth sequence of this embodiment. Note that the crystal growth of the III-V group nitrice semiconductor layers constituting the semiconductor DBR of this embodiment was performed by MOCVD using the same raw material gases as those of the first embodiment. Furthermore, the undoped GaN buffer layer 13 was grown on the growth substrate 11.

First, on the undoped GaN buffer layer 13, the first nitride semiconductor film 15A was grown. More specifically, at a substrate temperature Ts of 815° C. (=TP1: the first growth temperature), nitrogen ($N_2$) was supplied as a carrier gas (or ambient gas) ("ON" in the figure), TMA and TMI, which are a group III MO material, and ammonia ($NH_3$) or a group V material were supplied into a reaction furnace ("ON" in the figure), and thus the first nitride semiconductor film 15A or an $Al_{0.82}In_{0.18}N$ crystal layer was grown (time T=T21 to T22).

Next, while the substrate temperature Ts was being maintained at 815° C. (=TP1) and ammonia ($NH_3$) was being supplied, the supply of TMI was stopped (T22, in the figure, III(In) "OFF"), the supply of TMA was stopped 10 seconds after TMI was stopped (T23, in the figure, III(A1) "OFF"), and the inter-film transition layer 15c was thus formed. Note that the supply of TMA for 10 seconds after TMI was stopped is equivalent to the condition of forming an AlN crystal layer in a layer thickness of about 1 nm.

Subsequently, as the second nitride semiconductor film 15B, the crystal growth of the GaN cap layer and the GaN layer was performed. More specifically, TEGa was supplied into the reaction furnace to form the GaN crystal layer in a layer thickness of 5 nm (T23 to T24). Subsequently, the supply of TEGa was stopped (T24 to T25). Subsequently, the carrier gas was switched from nitrogen to hydrogen, and the substrate temperature Ts was raised to 1050° C. (=TP2: the second growth temperature) (T25 to T26). Then, TMGa was supplied to grow the GaN crystal layer (T26 to T27). After the GaN crystal layer was grown, the supply of TMGa was stopped, and the substrate temperature Ts was decreased to 815° C. (=TP1) (T=T27 to T28).

Subsequently, following the aforementioned growth sequence, the growth of the first nitride semiconductor film 15A (T=T21 to T22) and the growth of the inter-film transition layer 15C and the second nitride semiconductor film 15B (T=T22 to T28) were alternately repeated. Note that in this embodiment, the first nitride semiconductor film 15A and the second nitride semiconductor film 15B were alternately layered in 41 layers and 40 layers, respectively.

As described above, after the growth of the first nitride semiconductor film 15A and before the growth temperature for growing the second nitride semiconductor film 15B is reached, the supply of TMI or one group-III material gas constituting the first nitride semiconductor film 15A was first stopped, and after that, the supply of TMA or the other group-III material gas was stopped. Subsequently, the GaN cap layer was formed in a layer thickness of 5 nm, and then the temperature of the substrate was raised to the growth temperature of the second nitride semiconductor film 15B to form the second nitride semiconductor film 15R. Thus, the inter-film transition layer 15C was formed between the first nitride semiconductor film 15A and the second nitride semiconductor film 15B.

As described above, the first nitride semiconductor film 15A, the inter-film transition layer 15C, and the second nitride semiconductor film 15B were grown repeatedly in that order so as to form the semiconductor multilayer film reflecting mirror 15.

Note that the second nitride semiconductor film 15B is preferably grown in an ambient gas containing hydrogen or only in a hydrogen gas. Note that in FIG. 8, the broken line in the flow of $N_2$ (T25 to T27) denotes the case in which the supply of the nitrogen gas was stopped and only the hydrogen gas was used as an ambient gas.

As described above, the manufacturing method of this embodiment can be employed to form the semiconductor multilayer film reflecting mirror 15. Furthermore, using the semiconductor multilayer film reflecting mirror 15 of the present invention, the aforementioned semiconductor light emission structure layer can be formed, and the aforementioned VCSEL using the same can be manufactured.

Note that in the first and second embodiments, the descriptions have been given of the examples where toe first nitride semiconductor film 15A is an AlInN layer and the second nitride semiconductor film 15B is a GaN layer. However, the embodiments are not limited thereto. The first nitride semiconductor film 15A may only have to be a nitride semiconductor containing In in the composition, and the second nitride semiconductor film 15B may only have to be a nitride semiconductor not containing In in the composition. For example, the first nitride semiconductor film 15A may also be an AlIn GaN layer. Meanwhile, the second nitride semiconductor film 15B may also be a nitride semiconductor such as an AlGaN layer that does not contain in.

Note that the inter-film transition layer 15C may not always have to be formed every time the first nitride semiconductor film 15A is grown, but is preferably formed every time the first nitride semiconductor film 15A is grown.

Furthermore, the description has been given of the example which employed the C-plane GaN substrate as a substrate for growing the multilayer film reflecting mirror. However, other substrates may also be employed. For example, the substrate to be employed may also be of C-plane sapphire, A-plane sapphire, R-plane sapphire, semipolar-plane GaN, or a nonpolar-plane GaN, AlN, ZnO, $Ga_2O_3$, GaAs, Si, SiC, or spinel ($MgAl_2O_4$).

Note that unless otherwise specified, in the aforementioned embodiments, the growth conditions (for example, the growth temperature, the growth time, and the raw material gas such as an MO raw material), and the layer thickness, the number of layers, and the doping concentration of the semiconductor layer were taken only by way of example. These can be set, as appropriate, depending on the semiconductor layer (composition), the light emission wavelength, or the element structure to be employed.

As described above, according to the semiconductor multilayer film reflecting mirror of the present invention, it is possible to significantly reduce the dislocation density of the semiconductor multilayer film reflecting mirror and achieve a high quality crystallinity, thereby providing the reflecting mirror with high reflectivity. It is also possible to significantly reduce the dislocation density of the semiconductor layer to be formed on the semiconductor multilayer film reflecting mirror. Thus, use of the semiconductor multilayer film reflecting mirror of the present invention makes it possible to provide a vertical cavity light-emitting element that has a high optical output and high reliability.

This application is based on a Japanese Patent Application No. 2016-241273 which is hereby incorporated by reference.

What is claimed is:

1. A semiconductor multilayer film reflecting mirror comprising:
    a plurality of semiconductor structure layers stacked on one another, each of the semiconductor structure layers including (i) a first nitride semiconductor film having a composition containing In (indium), (ii) an inter-film transition layer provided on the first nitride semiconductor film, and (iii) a second nitride semiconductor film provided on the inter-film transition layer and having a composition not containing In,
    wherein, in each of the plurality of semiconductor structure layers:
    a composition of the inter-film transition layer is varied from the composition of the first nitride semiconductor film to the composition of the second nitride semiconductor film;
    the inter-film transition layer includes a first transition layer formed on the first nitride semiconductor film and having a composition containing In and Al (aluminum), and a second transition layer formed on the first transition layer and having a composition containing Al and not containing In;
    in the first transition layer, a percentage of In content (atomic %) and a percentage of Al content decrease in a direction from the first nitride semiconductor film toward the second transition layer; and
    the percentage of In content in the first transition layer starts to decrease at a position closer to the first nitride semiconductor film than, or at a same position as, a position where the percentage of Al content starts to decrease.

2. The semiconductor multilayer film reflecting mirror according to claim 1, wherein in the first transition layer, the percentage of In content decreases at a greater rate than the percentage of Al content toward the second transition layer.

3. A semiconductor multilayer film reflecting mirror comprising:
    first nitride semiconductor films having a composition containing In (indium);
    second nitride semiconductor films having a composition not containing In, the first nitride semiconductor film and the second semiconductor film being alternately formed; and
    inter-film transition layers provided between the alternately formed first nitride semiconductor films and second nitride semiconductor films, a composition of each of the inter-film transition layers being varied from the composition of the first nitride semiconductor film to the composition of the second nitride semiconductor film,
    wherein:
    each of the inter-film transition layers includes a first transition layer formed on the first nitride semiconductor film and having a composition containing In and Al (aluminum), and a second transition layer formed on the first transition layer and having a composition containing Al and not containing In;
    in each of the first transition layers, a percentage of In content (atomic %) and a percentage of Al content decrease in a direction from the first nitride semiconductor film toward the second transition layer;
    the percentage of In content in each of the first transition layers starts to decrease at a position closer to the first nitride semiconductor film than, or at a same position as, a position where the percentage of Al content starts to decrease;
    in each of the first transition layers, the percentage of In content decreases at a greater rate than the percentage of Al content toward the second transition layer;
    the composition of the second nitride semiconductor films contains Ga (gallium);
    each of the first transition layers is a composition varying layer of AlGaInN configured such that, from the first nitride semiconductor film to the second transition layer, a percentage of Ga content gradually increases, the percentage of Al content decreases in a monotonous or stepwise manner, and the percentage of In content decreases to substantially zero in a monotonous or stepwise manner; and
    each of the second transition layers is a composition varying layer of AlGaN configured such that the percentage of Al content decreases to substantially zero in a monotonous or stepwise manner from the first transition layer to the second nitride semiconductor film.

4. The semiconductor multilayer film reflecting mirror according to claim 1, wherein the first nitride semiconductor film is an AlInN layer.

5. The semiconductor multilayer film reflecting mirror according to claim 1, wherein the second nitride semiconductor film is a GaN layer.

6. A semiconductor multilayer film reflecting mirror comprising:
    first nitride semiconductor films having a composition containing In;
    second nitride semiconductor films having a composition not containing In, the first nitride semiconductor film and the second semiconductor film being alternately formed; and
    inter-film transition layers provided between the alternately formed first nitride semiconductor films and second nitride semiconductor films, a composition of each of the inter-film transition layers being varied along a layer thickness direction from the composition of the first nitride semiconductor film to the composition of the second nitride semiconductor film,
    wherein:
    each of the inter-film transition layers includes a first transition layer formed on the first nitride semiconductor film and having a composition containing In and Al, and a second transition layer formed on the first transition layer and having a composition containing Al and not containing In; and
    in each of the first transition layers, with respective maximum values of percentages of Al content and In content in the first nitride semiconductor film being normalized to 1, a normalized percentage of In content is less than a normalized percentage of Al content at any position in the layer thickness direction.

7. A vertical cavity light-emitting element comprising:
    the semiconductor multilayer film reflecting mirror according to claim 1, employed as a first reflecting mirror;
    a first semiconductor layer formed of at least one semiconductor layer on the first reflecting mirror;

an active layer formed on the first semiconductor layer;
a second semiconductor layer formed on the active layer and including at least one semiconductor layer having a conductivity type opposite to that of the first semiconductor layer; and
a second reflecting mirror formed on the second semiconductor layer and opposed to the first reflecting mirror.

8. A method for manufacturing a semiconductor multilayer film reflecting mirror by a metal-organic chemical vapor deposition (MOCVD), the method comprising a multilayering step of alternately growing in a repeated manner a first nitride semiconductor film having a composition containing In and a second nitride semiconductor film having a composition not containing In, wherein the multilayering step includes:
a step of growing the first nitride semiconductor film;
a step of forming an inter-film transition layer, the step of forming the inter-film transition layer being conducted by performing: a material gas supply step of supplying a material gas for the second nitride semiconductor film, after growing the first nitride semiconductor film and before a growth temperature of the second nitride semiconductor film is reached, under a time condition for forming the second nitride semiconductor film of a layer thickness greater than 0 nm and not greater than 1 nm; a holding step of holding for a predetermined period of time, after the material gas supply step, by stopping the supply of the material gas for the second nitride semiconductor film; and a temperature raising step of raising, after the holding step, the growth temperature to the growth temperature of the second nitride semiconductor film; and
a step of growing, after the temperature raising step, the second nitride semiconductor film while supplying the material gas for the second nitride semiconductor film.

9. A method for manufacturing a semiconductor multilayer film reflecting mirror by a metal-organic chemical vapor deposition (MOCVD), the method comprising a multilayering step of alternately growing in a repeated manner a first nitride semiconductor film having a composition containing In and Al and a second nitride semiconductor film having a composition not containing In, wherein the multilayering step includes:
a step of growing the first nitride semiconductor film;
a step of forming an inter-film transition layer, the step of forming the inter-film transition layer being conducted by performing: a first stop step of holding for a predetermined period of time while stopping supply of an In material gas after growing the first nitride semiconductor film and before a growth temperature of the second nitride semiconductor film is reached; a second stop step of stopping supply of an Al material gas after the first stop step; a cap layer forming step of forming, after the second stop step, a cap layer formed of the second nitride semiconductor film while supplying a material gas for the second nitride semiconductor film; and a temperature raising step of raising, after the cap layer forming step, the growth temperature to the growth temperature of the second nitride semiconductor film; and
a step of growing, after the temperature raising step, the second nitride semiconductor film while supplying the material gas for the second nitride semiconductor film.

10. A method for manufacturing a vertical cavity light-emitting element, comprising:
a step of forming the semiconductor multilayer film reflecting mirror according to claim 1, as a first reflecting mirror;
a step of forming a first semiconductor layer formed of at least one semiconductor layer on the first reflecting mirror;
a step of forming an active layer on the first semiconductor layer;
a step of forming, on the active layer, a second semiconductor layer formed of at least one semiconductor layer having a conductivity type opposite to that of the first semiconductor layer; and
a step of forming, on the second semiconductor layer, a second reflecting mirror opposed to the semiconductor multilayer film reflecting mirror.

11. A vertical cavity light-emitting element comprising:
the semiconductor multilayer film reflecting mirror according to claim 6, employed as a first reflecting mirror;
a first semiconductor layer formed of at least one semiconductor layer on the first reflecting mirror;
an active layer formed on the first semiconductor layer;
a second semiconductor layer formed on the active layer and including at least one semiconductor layer having a conductivity type opposite to that of the first semiconductor layer; and
a second reflecting mirror formed on the second semiconductor layer and opposed to the first reflecting mirror.

12. A method for manufacturing a vertical cavity light-emitting element, comprising:
a step of forming the semiconductor multilayer film reflecting mirror according to claim 6, as a first reflecting mirror;
a step of forming a first semiconductor layer formed of at least one semiconductor layer on the first reflecting mirror;
a step of forming an active layer on the first semiconductor layer;
a step of forming, on the active layer, a second semiconductor layer formed of at least one semiconductor layer having a conductivity type opposite to that of the first semiconductor layer; and
a step of forming, on the second semiconductor layer, a second reflecting mirror opposed to the semiconductor multilayer film reflecting mirror.

* * * * *